United States Patent [19]

Fukuda et al.

[11] Patent Number: 5,262,257
[45] Date of Patent: Nov. 16, 1993

[54] MASK FOR LITHOGRAPHY

[75] Inventors: Yasuaki Fukuda, Hadano; Noriyuki Nose, Machida, both of Japan

[73] Assignee: Canon Kabushiki Kaisha, Tokyo, Japan

[21] Appl. No.: 3,867

[22] Filed: Jan. 11, 1993

Related U.S. Application Data

[63] Continuation of Ser. No. 550,988, Jul. 11, 1990, abandoned.

[30] Foreign Application Priority Data

Jul. 13, 1989 [JP] Japan .................................. 1-182022

[51] Int. Cl.⁵ .............................................. G03F 9/00
[52] U.S. Cl. ............................................ 430/5; 430/4; 430/22; 378/34; 378/35; 250/492.2
[58] Field of Search ................... 430/4, 5, 22; 378/34, 378/35; 250/492.2

[56] References Cited

U.S. PATENT DOCUMENTS

| | | | |
|---|---|---|---|
| 3,742,229 | 6/1973 | Smith et al. | 378/34 |
| 4,152,601 | 5/1979 | Kadota et al. | 378/35 |
| 4,806,442 | 2/1989 | Shirasaki et al. | 430/4 |
| 4,835,078 | 5/1989 | Harvey et al. | 430/22 |
| 4,939,052 | 7/1990 | Nakagawa | 430/5 |

FOREIGN PATENT DOCUMENTS

| | | | |
|---|---|---|---|
| 0195724 | 9/1986 | European Pat. Off. | |
| 0231916 | 8/1987 | European Pat. Off. | |
| 59-0163825 | 9/1984 | Japan | 430/22 |
| 60-0214531 | 10/1985 | Japan | 430/22 |
| 2-0001106 | 1/1990 | Japan | 430/22 |

OTHER PUBLICATIONS

Feldman et al, "Application of Zone Plates to Alignment in X-Ray Lithography", Chemical Abstracts, vol. 97, p. 641, 1982.

Kinsohita, et al., "A Dual Grating Alignment Technique for X-Ray Lithography", J. Vac. Sci. Tech. B 1(4), Oct.–Dec. 1983, pp. 1276–1279.

*Primary Examiner*—Charles L. Bowers, Jr.
*Assistant Examiner*—Thomas R. Neville
*Attorney, Agent, or Firm*—Fitzpatrick, Cella, Harper & Scinto

[57] ABSTRACT

A mask structure according to an aspect of the invention includes a base having a first zone for an alignment pattern and a second zone for a circuit pattern; an alignment pattern forming material with which the alignment pattern is formed in the first zone; and a circuit pattern forming material with which the circuit pattern is formed in the second zone; wherein the alignment pattern forming material and the circuit pattern forming material are different from each other.

23 Claims, 12 Drawing Sheets

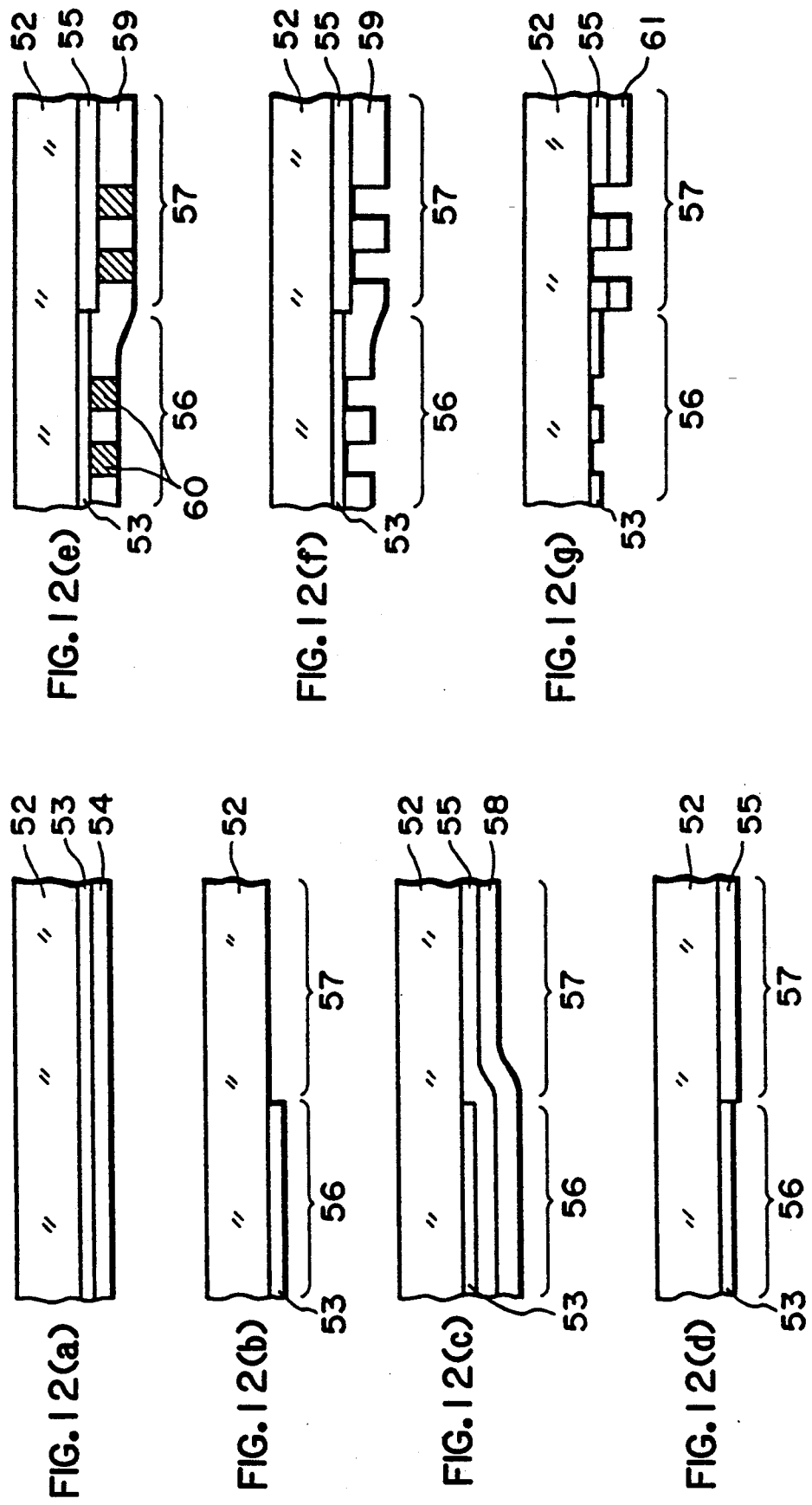

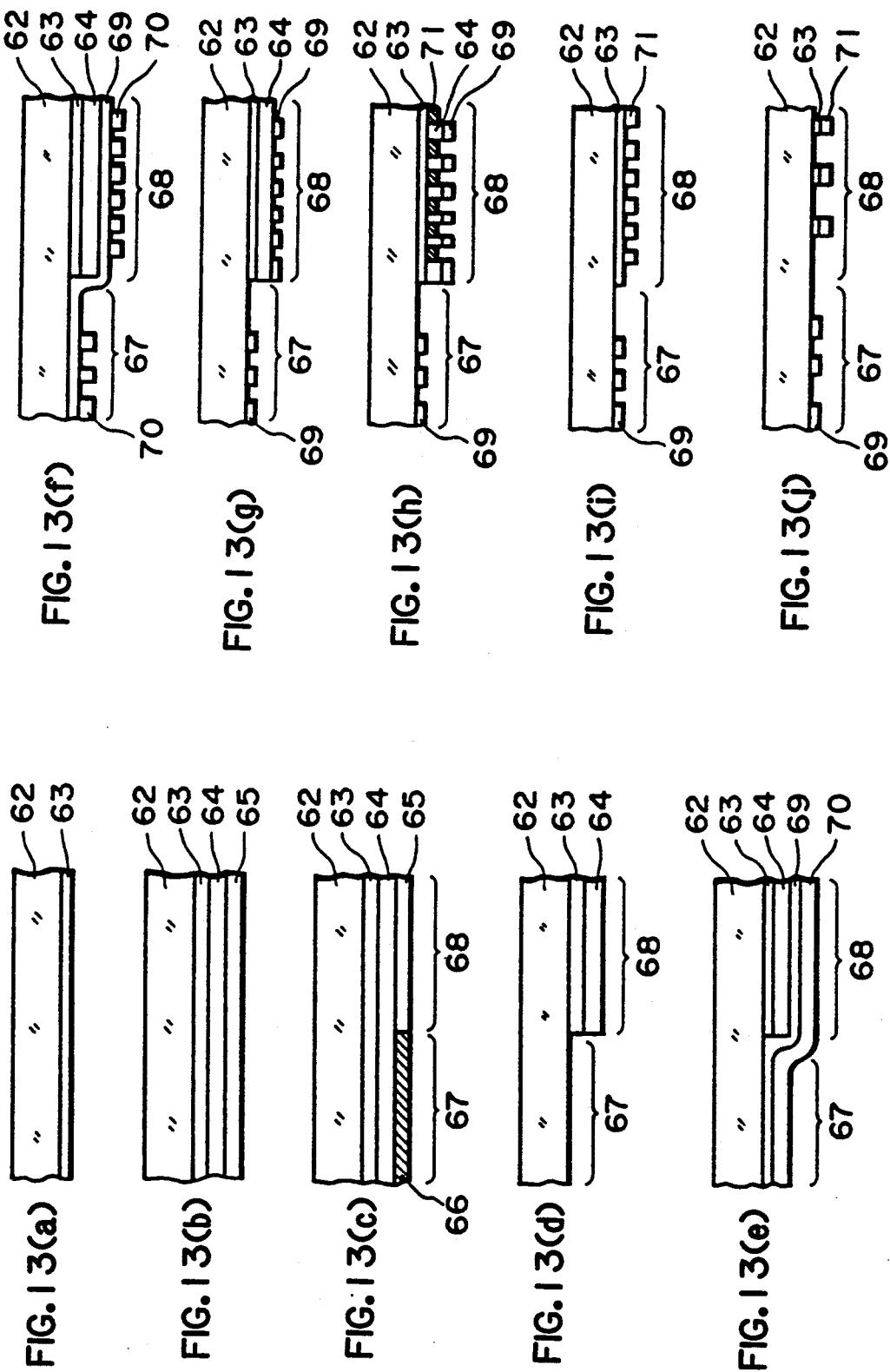

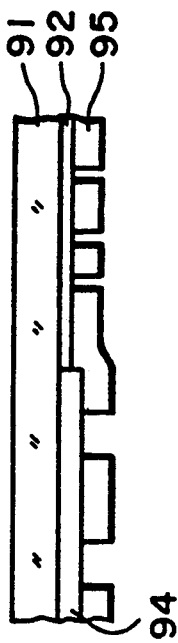
FIG. 17(f)
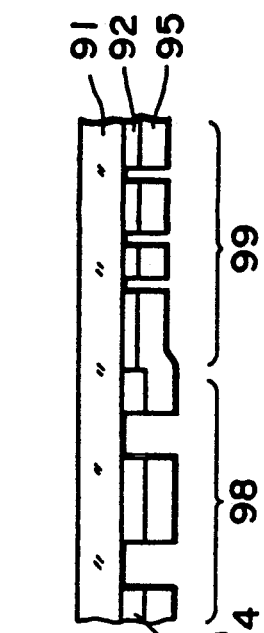
FIG. 17(g)
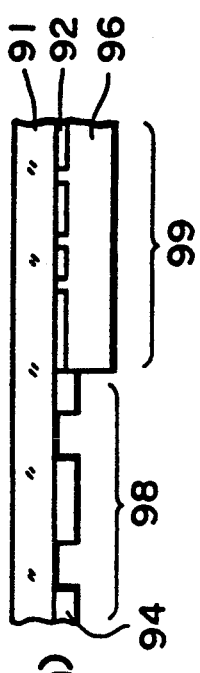
FIG. 17(h)
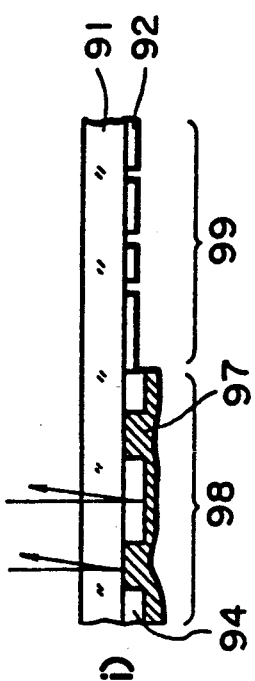
FIG. 17(i)
FIG. 17(a)
FIG. 17(b)
FIG. 17(c)
FIG. 17(d)
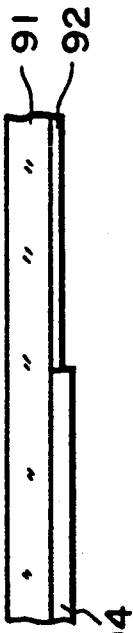
FIG. 17(e)

MASK FOR LITHOGRAPHY

This application is a continuation of prior application Ser. No. 07/550,988 filed Jul. 11, 1990, now abandoned.

FIELD OF THE INVENTION AND RELATED ART

This invention relates to a photomask and a method of manufacture of the same, which photomask is adapted to print fine patterns such as semiconductor integrated circuit patterns onto a semiconductor wafer, for example. More particularly, the invention is concerned with a mask (photomask) and a method of manufacture of the same, which mask is adapted to be suitably used in an X-ray exposure apparatus for manufacture of semiconductor microcircuit devices.

Generally, for manufacture of semiconductor devices, a reduction projection type exposure apparatus or a mirror projection one-to-one projection type exposure apparatus is used to print a circuit pattern, formed on a mask (reticle), upon a semiconductor wafer. Also, in recently developed proximity type exposure apparatuses using X-rays, a mask and a wafer are disposed with a spacing of 10–50 microns and, by using a phenomenon that a shadow of X-rays projected to the mask is formed on the wafer, a desired circuit pattern is printed on the wafer.

In these exposure apparatuses, high alignment precision as well as high throughput are required and, in this respect, to ensure high-precision and high-speed alignment of a mask (reticle) and a wafer is an important technical problem.

Conventionally used masks or reticles have such a structure as shown in FIG. 1, wherein a quartz glass substrate 1 is formed with a pattern of metal film 2 made of Cr or Al, for example, and having reflectivity, causing reflection light 3. Upon exposure, a pattern formed by transmitted light 4 from the pattern of metal film 2 is printed on a wafer by means of a reduction imaging exposure apparatus such as shown in FIG. 2 or a proximity exposure apparatus such as shown in FIG. 3. In FIG. 2, denoted at 6 is a reticle; at 5 is a semiconductor circuit pattern area defined on the reticle 6; at 7a–7d are marks provided on the reticle (mask) for mask-to-wafer alignment; and at 8 is a reduction imaging lens. Denoted at 9 is a wafer; at 10 is a semiconductor circuit pattern area defined on the wafer 9; at 11a–11d are marks provided on the wafer for the mask-to-wafer alignment; and at 18 is a reticle illuminating light (exposure light). Also, in FIG. 3, denoted at 12 is a one-to-one magnification (unit magnification) mask for the proximity exposure; at 13a–13d are marks provided on the mask for mask-to-wafer alignment; at 14 is a semiconductor circuit pattern area defined on the mask 12; at 15a–15d are marks provided on a wafer 15 for the mask-to-wafer alignment; at 16 is a semiconductor circuit pattern area defined on the wafer 15; and at 17 is a mask exposing light (illuminating light). The mask 12 and the wafer 15 are disposed opposed to each other, with a proximity gap d.

As regards the manner of aligning a mask with a wafer in such an exposure apparatus, various methods have been developed. One of them is such a method wherein a grating pattern having what can be called a "diffraction effect" is provided on a mask or reticle as an alignment mark and, also, another grating pattern is formed on a wafer as an alignment mark, and wherein by the action of diffraction of light between the mask and the wafer, a signal is produced and used to assure high-precision alignment.

As an example using this method, FIG. 4 illustrates the principle of what can be called a dual grating alignment method as proposed in "Journal of Vacuum Science and Technology" B1 (4), Oct.–Dec., 1983, from p. 1276. In the FIG. 4 example, the aforementioned alignment method is applied to a proximity type X-ray stepper. In FIG. 4, denoted at 19 is a mask; at 20 is a pattern of non-transparent metal film formed on the mask 19 in the form of a grating; at 21 is a wafer; and at 22 is a similar grating pattern formed by a material provided on the wafer 21 in a semiconductor process. Denoted at 23 is an inputted alignment laser light; and denoted at 24 and 25 are photoelectric converters. Here, as regards alignment signal light, positive and negative first order diffraction components of the light finally diffracted by the diffraction grating 20 of the mask 19 are directed to the photoelectric converters 24 and 25. The alignment detection is based on the interrelationship between the comparative intensity of the signals from the photoelectric converters 24 and 25 (e.g., "$I_{+1} - I_{-1}$") and (ii) the positional deviation between the mask 19 and the wafer 21. Since in this example the positive and negative first order diffraction lights from the mask 19 are used, the quantity of signal light impinging on the photoelectric converters 24 and 25 is influenced by the efficiency of positive and negative first order diffraction.

FIG. 5 illustrates an example of another alignment method. In FIG. 5, light emanating from a laser light source 33 is transformed by a collimator lens 32 into a parallel plane wave which is reflected by a half mirror 31 and impinges on an alignment pattern 26 on a mask 28. The alignment pattern 26 is formed as a physical optic element such as a zone plate, for example, having a lens function. A first order diffraction component of the light diffracted by the alignment pattern 26 is converged upon a point Q and, thereafter, it advances in the form of a divergent wave and impinges on an alignment pattern 27 on a wafer 34 which is disposed opposed to the mask 28, at a position spaced by a distance g. Similarly, the alignment pattern 27 is formed by a physical optic element like a zone plate, having a refracting function. First order diffraction light produced by the alignment pattern 27 passes through the half mirror 31 and forms a light spot 30 on a photosensor 29. In this example, when the position of the light spot 30 formed on the photosensor 29 coincides with an optical axis Q' of the alignment patterns 26 and 27 of the mask 28 and the wafer 34, the alignment of the mask 28 and the wafer 34 is accomplished.

As regards the grating mark to be provided as the alignment pattern 26 or 27, a typical example is a zone plate such as shown in FIG. 6. In FIG. 6, painted portions depict those areas on which the metal film non-transmissive to light is present, whereas blank portions depict those areas through which light can be transmitted.

In these examples, in addition to the light of desired diffraction order or orders (positive and negative first orders in the examples of FIGS. 4 and 5, zero-th order light (rectilinear component), ghost light resulting from multiple reflection, scattered light from edges of an alignment pattern, or the like impinges on the photosensor as a noise component. The ratio of the signal light component of a desired diffraction order (positive and negative first order light in the examples of FIGS. 4 and 5) to such a noise component determines the signal-to-noise ratio in terms of the light intensity level. Degradation of the signal-to-noise ratio directly results in a difficulty in ensuring accurate alignment. Therefore, in the examples described above, specific measures will be necessary to assure that strong signal light of desired diffraction orders is efficiently directed to the photosensor. Here, the alignment signal light deeply depends on the diffraction efficiency of a grating provided on a mask.

SUMMARY OF THE INVENTION

It is accordingly an object of the present invention to provide a mask having a high diffraction efficiency by which the signal-to-noise ratio of the alignment signal light can be improved to assure high-precision and high-speed alignment.

It is another object of the present invention to provide a method of manufacture of such a mask.

It is well known that, as compared with a diffraction grating formed by light transmitting areas and light non-transmitting areas such as shown in FIG. 1, a grating pattern of a type composed only of light transmitting areas such as shown in FIG. 7 has a high diffraction efficiency. For example, with regard to the first order light, the diffraction grating of the FIG. 7 example has a diffraction efficiency which is about four times higher than that of the diffraction grating of the FIG. 1 example. A phase grating may have a maximum first order diffraction efficiency of about 40%, whereas an amplitude grating may have a maximum first order diffraction efficiency of 10%. Accordingly, if an alignment pattern of a mask is formed by a light transmissive dielectric material film 36 such as shown in FIG. 7, the alignment signal light increases significantly and, thus, the signal-to-noise ratio improves correspondingly, such that high-precision and high-speed alignment is possible.

For an X-ray mask to be used in an X-ray exposure apparatus, in many cases, the printing of a circuit pattern on a wafer is performed with X-rays whereas the alignment operation is performed with light. In consideration thereof, as a circuit pattern on a mask, a film of Au or Ta, for example, which is a material that produces contrast to the X-rays, may be provided with a thickness of 0.5–1.0 micron. On the other hand, as an alignment pattern, a metal film of Cr or Al, for example, producing contrast to light, may be provided with a thickness of 0.1 micron. Alternatively, a dielectric material film of $SiO_2$ or $MgF_2$, for example, may be provided. Thus, on an occasion when the pattern to be exposed to the X-rays is formed by a thick film of Au or Ta, having a thickness of 0.5–1.0 micron, the alignment pattern may be formed by a thin film of Cr or Al of a thickness of 0.1 micron, and in that case scattered light from the alignment pattern during the alignment operation can be reduced sufficiently, as compared with the scattered light to be produced when the alignment pattern is formed by a thick film of Au or Ta.

An example of such an X-ray mask is illustrated in FIG. 8. In FIG. 8, denoted at 104 is a circuit pattern area; denoted at $105_1$–$105_4$ are alignment pattern areas to be used for the alignment with respect to a current layer on a wafer; and at $106_1$–$106_4$ are alignment patterns to be printed on the wafer through the current exposure for the alignment with respect to the subsequent layer. Here, the alignment patterns $105_1$–$105_4$ may be formed by a Cr film with a thickness of about 0.1 micron, while the alignment patterns $106_1$–$106_4$ as well as the circuit pattern 104 may be formed by a Ta film with a thickness of 0.7–1.0 micron. This provides a mask by which sufficient contrast is obtainable upon the X-ray exposure and, additionally, noise such as scattered light is reduced at the time of an alignment operation.

It is a further object of the present invention to provide such a mask and a method of manufacture of the same.

It is yet another object of the present invention to provide a mask manufacturing method for manufacturing, with good efficiency and high precision, a mask having a circuit pattern and an alignment pattern which are formed of different materials.

Referring back to FIG. 7, denoted at 35 is a mask substrate; at 41 is an alignment laser light; at 36 is a light transmissive film which forms a grating pattern. The film 36 has a thickness t and, if the thickness t is determined to satisfy the following relation, the maximum diffraction efficiency is obtainable with respect to the positive and negative first order diffraction:

$$(n-1) \times T = \lambda/2 \times N$$

where n is the index of refraction of the film 36, $\lambda$ is the wavelength of the alignment light and N is an odd number. If the thickness t is changed to be deviated from this relation, the diffraction efficiency decreases accordingly. The film 36 may not be of a single layer structure, but it may have a multilayered structure. It is only required that the optical path difference of the laser light 41 (a value corresponding to "$(n-1)t$") produced substantially by the surface height difference (film thickness) between a portion having a film 36 and a portion having no film, is equal to a multiple, by an odd number, of a half ($\lambda/2$) of the wavelength $\lambda$ of the laser light 41.

In another aspect, as shown in FIG. 9, alignment patterns 39a–39d are provided in a scribe area 38 around a desired electric circuit pattern 37. In order to accomplish a semiconductor process through which a number of layers are formed, what is important is the relationship in the spaced disposition of the alignment patterns 39a–39d to the circuit pattern 37, and thus the alignment patterns 39a–39d should be formed with a precise interval setting, with respect to the circuit pattern 37. Usually, a mask (reticle) pattern is drawn by an electron beam projected, in a single printing operation, to a circuit pattern area and an alignment pattern area and, by this, the above-described requirements are satisfied. A known type mask is illustrated in a sectional view of FIG 10. Denoted at 42 is a mask base; at 44 is a metal film made of Ta, Au or Cr, for example, wherein an alignment pattern 46 and a semiconductor circuit pattern 47 are made from the same material as that of metal film 44.

The present invention aims to provide a mask manufacturing method by which a mask can be manufactured without degrading the precision of the relative position of an alignment pattern to a circuit pattern even on an occasion when the circuit pattern and the alignment pattern are formed of different materials.

Referring back to FIG. 9 showing patterns on a mask, denoted at 38 is a scribe area on which alignment patterns 39a–39d are provided; and at 37 is a semiconductor circuit pattern. The alignment patterns 39a–39d each comprise a grating pattern such as a zone plate, for example, being provided on the mask for the alignment purpose. Four patterns are illustrated in FIG. 9, since that illustrated in FIG. 9 is an example wherein each alignment pattern is effective to perform the detection with respect to one direction. For example, the alignment pattern 39a is effective to perform the detection only with respect to the direction of an arrow 41a in FIG. 9. In the illustrated example, it is important that the pattern 39a is formed with its central line 40a being set at a predetermined position with respect to the detecting direction 41a for the positioning.

A mask manufacturing method according to an aspect of the present invention comprises a processing step for forming a circuit pattern area and an alignment pattern area with their pattern forming materials providing surface layers, respectively, and a subsequent step for drawing, in a single printing operation, patterns on these areas with the use of an electron beam to form the patterns in these areas.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 12(a) through 12(h) are a schematic representation, showing a second embodiment of the present invention.

FIGS. 13(a) through 13(h) are a schematic representation, showing a third embodiment of the present invention.

FIGS. 16(a) through 16(h) are a schematic representation, showing a fifth embodiment of the present invention.

FIGS. 17(a) through 17(h) are a schematic representation, showing a sixth ,embodiment of the present invention.

DESCRIPTION OF THE PREFERRED EMBODIMENTS

Embodiment 1

Figure 1:
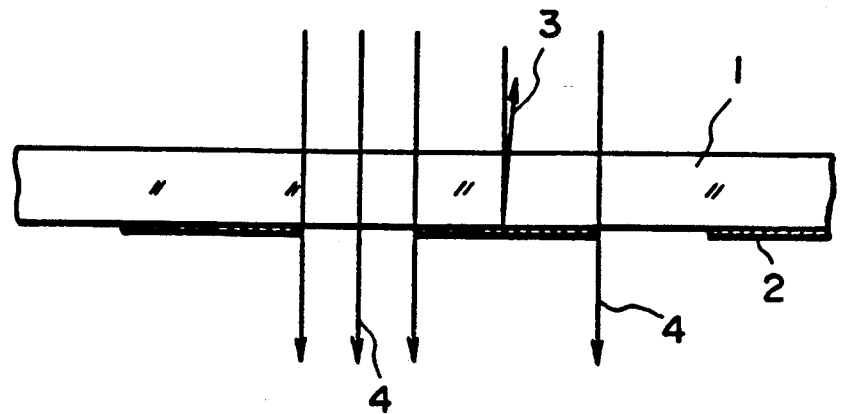
FIG. 1 is a schematic view showing an example of a known type mask.
Figure 2:
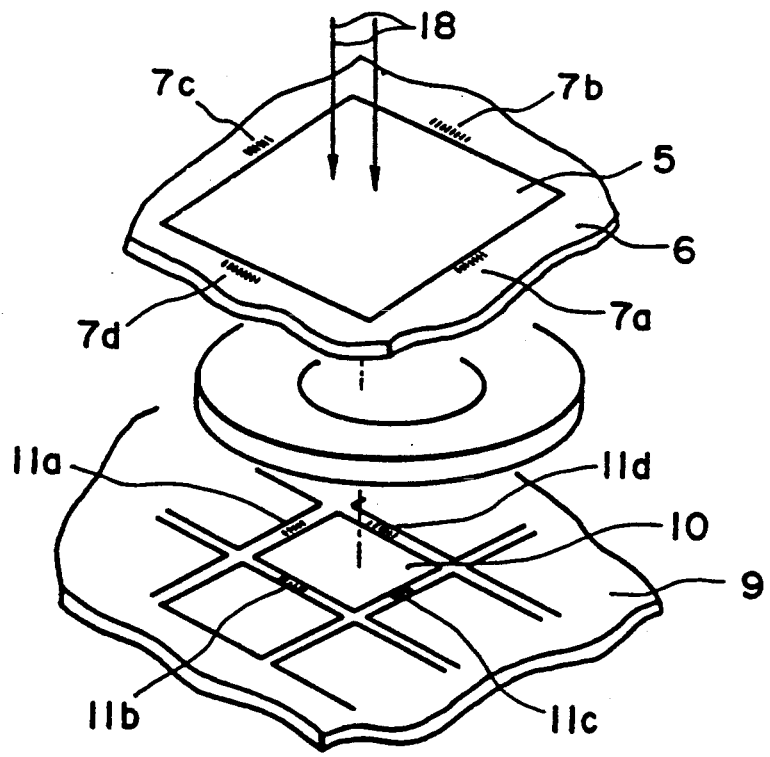
FIG. 2 is a schematic view showing an example of a projection type exposure apparatus.
Figure 3:
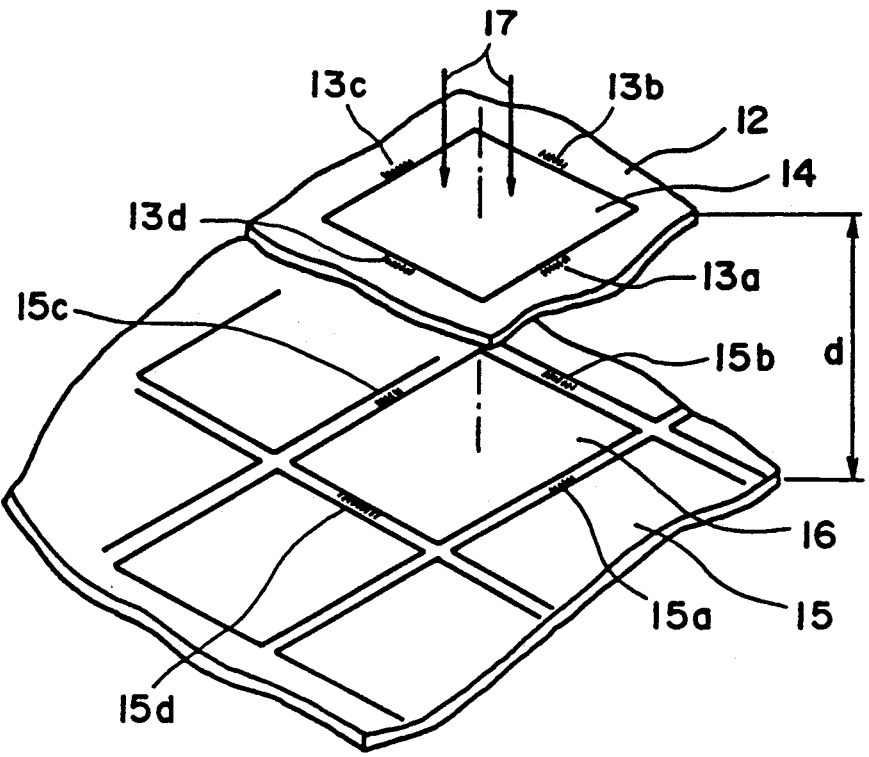
FIG. 3 is a schematic view showing an example of a proximity type exposure apparatus.
Figure 4:
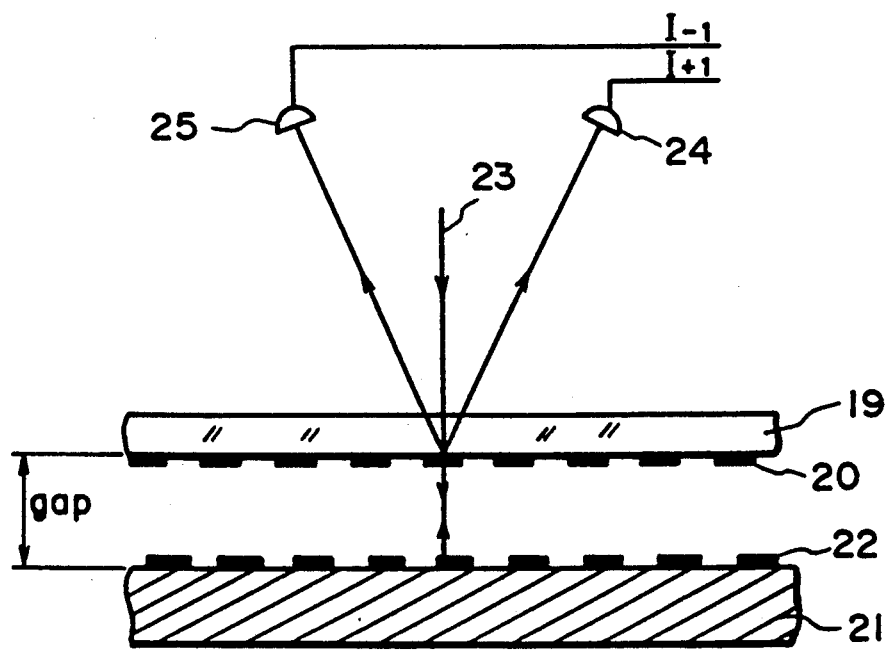
FIG. 4 is a schematic view, illustrating the principle of a conventional alignment method that uses gratings.
Figure 5:
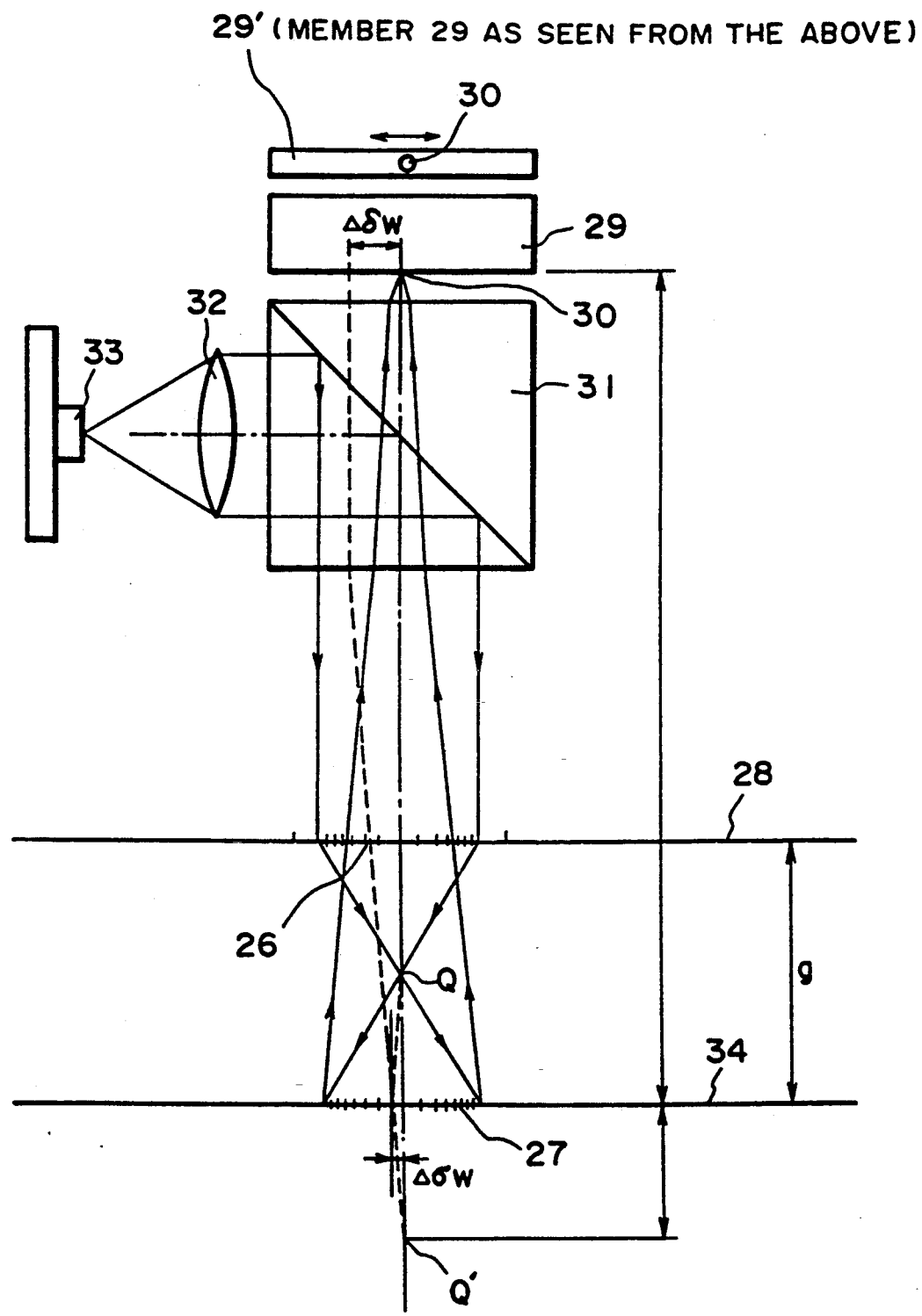
FIG. 5 is a schematic view of an alignment system using gratings.
Figure 6:
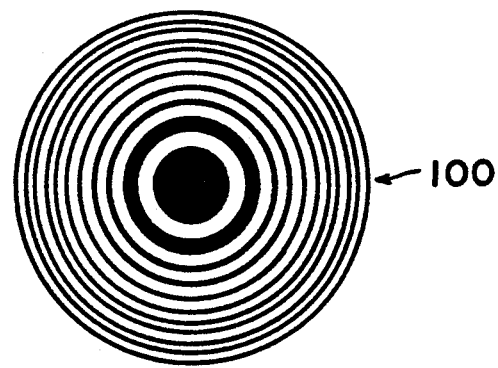
FIG. 6 is a plan view showing an example of a zone plate alignment pattern.
Figure 7:
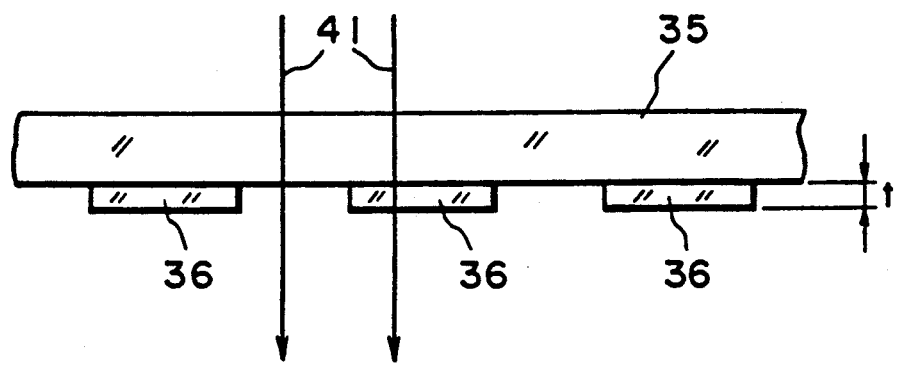
FIG. 7 is a schematic view showing an example of a mask having a phase grating pattern.

FIGS. 11(a) through 11(h) illustrates an embodiment of the present invention. Part (a) to part (h) illustrate the sections of masks which are formed in accordance with the sequence of mask manufacturing processes. Part (a) shows a mask having been subjected to such processes by which a dielectric material thin film 43 is provided on a base 42 of the mask by vacuum deposition and a thin film 44 of gold, Cr or Ta, for example, is provided on the dielectric thin film 43. The thickness of the dielectric material film 43 is set appropriately in accordance with a desired diffraction efficiency. Part (b) illustrates the result of a resist 45 being applied to the mask of part (a). Part (c) illustrates the result of that, after the resist 45 application, the photo-exposure, for example, has been performed to remove all of the portion of the resist 45 material in the alignment pattern area 46. As a consequence of the exposure of the alignment pattern area 46 to the light, in the subsequent step of part (d) the metal film 44 on the alignment pattern area 46 can be removed. In part (c), reference numeral 48 denotes the portion of the resist having been exposed to the light. Also, reference numeral 47 denotes a semiconductor circuit pattern area. Precision not greater than 1-2 microns is sufficient for the patterning to remove the resist 45 by exposure to light. Part (d) illustrates the result obtained by performing development of the resist material after the exposure in part (c), by which the portion 48 of the resist 45 exposed to the light is removed. After this, based on the thus formed resist pattern, the metal thin film 44 of Au, Cr or Ta, for example, is subjected to dry etching. By this, in the alignment pattern area 46, the metal film 44 of Au, Cr or Ta, for example, which can provide contrast during exposure for the printing of the semiconductor circuit pattern, is removed whereby only the dielectric material film 43 remains in the alignment pattern area 46.

Thereafter, as shown in part (e), a resist 48 is applied to the mask. The resist 48 is provided for the exposure with an electron beam for the drawing of alignment patterns and a semiconductor circuit pattern. In part (f), by using an electron beam, an alignment pattern or patterns are drawn on the area 46 while a semiconductor circuit pattern is drawn on the area 47, through a single printing operation. This is done in consideration of the necessity that the alignment pattern drawn in the alignment pattern area 46 and the semiconductor circuit pattern drawn in the semiconductor circuit pattern area 47 are maintained in a precisely ensured positional relationship, corresponding to the required high alignment precision.

In part (f), portions 50 depicted by hatching denote the regions exposed with the electron beam. After the electron beam pattern drawing, the resist material is developed. The result is illustrated in part (g). In the state of part (g), based on the thus formed resist pattern, dry etching is performed. As a result, the metal film 44 and the dielectric material film 43 are etched. By adjusting the etching rate, it is possible to assure that, when the etching of the dielectric material film 43 is just completed, the etching of the metal film 44 is also completed. On an occasion when the dielectric material film 43 is made of $SiO_2$ and the metal film 44 is made of Au, a gas of $CClF_3/C_2F_6$ may be used as an etching gas, and after completion of the etching of the alignment pattern area 46, CCl₄ may be used for the over-etching to remove oxides of gold, if any.

After this, in order to assure that the mask presents desired contrast with respect to the printing light, plating may be made to the metal film 44 if it is made of Au, for example.

As a result of the processes (a) to (h), such a mask which is of a phase type having its alignment pattern formed by a dielectric material film 43 transmissive to the alignment light, in which mask the positional relationship between the alignment pattern and the semiconductor circuit pattern is ensured with high precision, and in which desired contrast can be provided to the circuit pattern printing light, is manufactured.

As examples of materials for the dielectric film 43, there are $SiO_2$, $ZrO_2$, $MgF_2$, $TiO_2$, $Al_2O_3$ and the like. As regards the material of the metal film 44, examples are Au, Ta, W, WNx (tungusten nitride) and the like.

Also, as regards the mask base material 42, a polyimide membrane, or alternatively, any one of SiN, AlN, $SiO_2$, SiC and the like may be used.

Embodiment 2

FIGS. 12(a) through 12(h) illustrates a second embodiment of the present invention. Part (a) to part (g) show the steps of manufacturing a phase type mask, and description will be made in a similar manner as made with reference to Embodiment 1 shown in FIGS. 11(a) through (h).

First, as seen in part (a), a dielectric material film 53 is formed on a mask base material 52 by vacuum deposition, for example, and then a resist 54 is applied thereto. The dielectric material film 53 may be made of any one of $SiO_2$, $ZrO_2$, $MgF_2$, $TiO_2$, $Al_2O_3$ and the like. The thickness of the dielectric material film 53 is determined appropriately in accordance with a desired diffraction efficiency. Subsequently, in order to assure that the dielectric material film 53 is left only in the alignment pattern area 56, such area other than the alignment area 56 (that is, the semiconductor circuit pattern area 57) is exposed to light or the like. After this, the resist is developed and then the dielectric film 53 is dry-etched. The result is illustrated in part (b). Thereafter, the whole surface is coated with a metal film 55 by vacuum deposition and, additionally, a resist 58 is applied thereto. The metal film 55 may be made of any one of Au, Cr, Al, Cu and the like. Light exposure or electron beam exposure is performed to this resist 58, so as to sensitize the portion of the resist 58 over the alignment pattern area 56. By developing this resist, only the portion of the resist material on the alignment pattern area 56 is removed and the metal film 55 is uncovered. Thus, the resist material remains only on the semiconductor circuit pattern area 57. Based on this resist, the metal film 55 is dry-etched, so that the metal film 55 on the alignment pattern area 56 is removed. Then, by removing the remaining resist, the result such as illustrated in part (d) is obtained. Then, as seen in part (e), a resist 59 is applied to the mask and, in order to provide an ensured positional relationship between an alignment pattern to be drawn on the alignment pattern area 56 and a semiconductor circuit pattern to be drawn on the semiconductor circuit pattern area 57, an electron beam patternwise exposure is performed in a single printing operation. The result is shown in part (e). The portions 60 depicted by hatching denote the portions exposed to the electron beam. After the electron beam pattern drawing, the resist is developed and, on the basis of a resultant resist pattern, dry etching is performed. Such dry etching is performed until the dielectric material film 53 is etched to define a desired surface height difference. At this time, the metal film 55 is also etched patternwise. After this, by plating or the like, a metal material is deposited on the metal film 55 so as to assure sufficient thickness of the metal film on the semiconductor circuit pattern area 57, providing contrast as required for a mask to the semiconductor circuit printing light (X-rays). Part (f) shows the state after completion of the resist development and before execution of the dry etching. Part (g) shows the state in which, by plating or the like, a material the same as that of the metal film 55 has been deposited thereon. For example, if the metal film 55 is made of Au, the film 61 is provided by an Au film deposited by plating.

With the method described hereinbefore, like Embodiment 1, a phase type mask in which an alignment pattern comprises a dielectric material film transmissive to the alignment light, in which the positional relationship between the alignment pattern and the semiconductor circuit pattern is ensured with high precision and which has a desired contrast with respect to the circuit pattern printing light.

Embodiment 3

FIGS. 13(a) through 13(j) show a third embodiment of the present invention. With reference to FIGS. 13(a) through 13(j), description will be made of a case wherein a mask base material 62 is composed of SiN. Actually, however, the mask base material is not limited to SiN, but it may be made of quartz, polyimide film or, alternatively, any one of AlN, SiC and the like. In this particular case, description will be made of an example wherein the SiN material is used. Part (a) to part (g) illustrate the sequential steps of the third embodiment. First, as seen in part (a), a metal film 63 made of Au, Cr, Ta, Cu or the like is formed by vacuum deposition. The metal film may have a small thickness not greater than 100 angstroms.

Subsequently, the metal film 63 is coated with polyimide varnish (layer 64), for example, PiQ (trade name) manufactured by Hitachi Kasei Corporation, Japan, to a sufficient thickness (0.8–1.0 micron). Then, it is further coated with a resist 65. This resist 65 is then subjected to light exposure, only in the portion corresponding to the alignment pattern area 67 to allow that the metal film 63 and the varnish 64 on the alignment pattern area 67 are removed. After this, the resist is developed. Part (c) illustrates the state before the resist is removed. Reference numeral 67 denotes the alignment pattern area, and reference numeral 68 denotes the semiconductor circuit pattern area. The portions 66 depicted by hatching denote the portions of the resist 65 having been exposed to the light. Thereafter, the varnish 64 is subjected to wet etching and, then, the metal film 63 is subjected to wet etching. By this, the varnish 64 and the metal film 63 in the alignment pattern area 67 are removed. After this, the resist 65 on the semiconductor circuit pattern area 68 is removed. The result is such as illustrated in part (d). In part (e), subsequent to part (d), a dielectric material film 69 made of $SiO_2$ or $MgF_2$, for example, transparent to the alignment light, is formed by vacuum deposition and, thereafter, a resist 70 is applied thereto. After this, in order to precisely define a predetermined positional relationship between an alignment pattern to be drawn on the alignment pattern area 67 and a semiconductor circuit pattern to be drawn on the semiconductor circuit patter area 68, electron beam pattern drawing is performed to these areas in a single printing operation. Then, the resist 70 is developed. The result is illustrated in part (f). By dry etching with use of $CF_4$ (carbon tetrafluoride), for example, the dielectric material film 69 is etched patternwise in accordance with the pattern of the resist 70 for electron beam exposure. Thereafter, the resist is removed, and the result is such as shown in part (g). Further, by dry etching with use of $O_2$ (oxygen), the varnish 64 is patterned on the basis of the pattern of the dielectric material film 69. Then, while using the thus obtained varnish 64 pattern as a masking member, an Au material is deposited by plating to form a metal film 71 depicted by hatched portions. Here, the thickness $d_1$ of the polyimide varnish 64 and the thickness $d_2$ of the metal film 71 satisfy the relation $d_1 > d_2$. Subsequent wet etching of the varnish 64 results in formation of a final pattern such as illustrated in part (i). In part (i), the metal film 63 (e.g , Au) may have a thickness not greater than 100 angstroms and the metal film 71 may have a thickness of about 0.1-1 micron and, with this structure, desired contrast with respect to the circuit pattern printing light is obtainable. Further, if the metal film 71 is made of Au, for example, dry etching may be made to the Au material in the state of part (i) by using $Cl_2$ or, alternatively, wet etching may be made thereto, so as to pattern the metal film (Au film) 63. By this, a mask such as illustrated in part (j) can be obtained.

Embodiment 4

FIGS. 14(a) through 14(h) show a fourth embodiment of the present invention. Referring to FIGS. 14(a) through 14(h) description will be made of a case wherein a mask base material 72 is provided by a polyimide film. Actually, however, the mask base material is not limited to polyimide.

Part (a) to part (h) illustrate sequential steps of the fourth embodiment.

First, as seen in part (a), a metal film 73 made of Au, for example, is formed by vacuum deposition. The metal film may have a small thickness not greater than 300-700 angstroms. Resist material is applied to the metal film 73 and, for the definition of a separate alignment pattern area 74 and semiconductor circuit pattern area 75, light exposure is made to the alignment pattern area 74. After this, the resist is developed and removed. Then, the uncovered portion of the metal film 73 is removed by etching. By subsequently removing the residual resist, a film structure such as illustrated in part (b) is provided.

Thereafter, the film structure of part (b) is coated with a polyimide varnish 76, for example, PiQ (trade name) manufactured by Hitachi Kasei Corporation, Japan. Here, if the film thickness d of the varnish 76 satisfies the following relation, the first order diffraction efficiency of the phase grating constituting the alignment pattern becomes maximum:

$$(n-1)d = \lambda/2 \times N$$

where n is the index of refraction of the varnish, $\lambda$ is the wavelength of the alignment light and N is an odd number. The film thickness d of the varnish 76 may be set in accordance with a desired diffraction efficiency. After this, a resist 77 is applied to the varnish 76, and the result is illustrated in part (c). Subsequently, an electron beam is used to draw an alignment pattern in the alignment pattern area 74 and a semiconductor circuit pattern in the semiconductor circuit pattern area 75, in a single printing operation. Then, the resist 77 is developed. By using the thus formed pattern of the resist 77, the varnish 76 is subjected to wet etching and, by the subsequent Au plating, the structure as illustrated in part (d) results Reference numeral 78 denotes the Au film (hatched areas) formed by the plating. The thickness of the Au film 78 is set so as to provide sufficient contrast with respect to the printing light. After this, as seen in part (e), a resist 80 is uniformly applied and, in order to remove the varnish 76 on the semiconductor circuit pattern area 75, light exposure is made to the entirety of this area. The portion 79 depicted by hatching denotes the portion of the resist 80 having been exposed. Then, the resist is developed and wet etching of the varnish 76 is performed. The result is illustrated in part (f). After this, the entirety of the alignment pattern area 74 is exposed to light and, by the subsequent development of the resist 80, a finally desired mask is produced, as illustrated in part (g) wherein reference numeral 76 denotes a polyimide varnish, numeral 78 denotes an Au film and numeral 73 denotes a thin Au film. In order to assure sufficient contrast to the semiconductor circuit pattern printing light, the film 73 has a thickness which is set to be sufficiently small as compared with that of the film 78. Further, if desired the Au film may be subjected to dry etching with an Ar gas or, alternatively, to wet etching, then a mask having the structure such as that illustrated in part (h) can be obtained.

In this embodiment, like Embodiments 1-3, the mask base material is not limited to polyimide, but any one of quartz, SiN, $Al_2O_3$ and the like may be used. Also, the metal film may be made of a material such as Cr, Ta, Cu or the like.

While the first to fourth embodiments have been described with reference to a method of manufacture of such a mask as having a transmission type phase grating for effective utilization of transmitted light (diffracted light), as a matter of course, it is possible to utilize reflectively diffracted light with a mask having such a phase grating.

Figure 15:
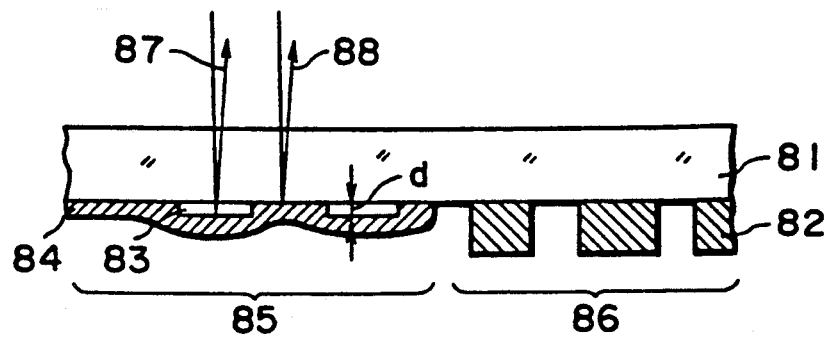
FIG. 15 is a schematic view, showing an example of a mask having a reflection type phase grating.
Figure 16A:
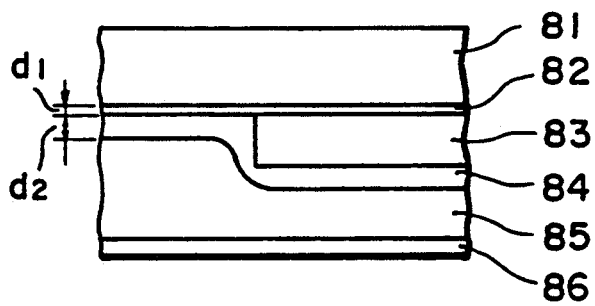
Figure 16B:
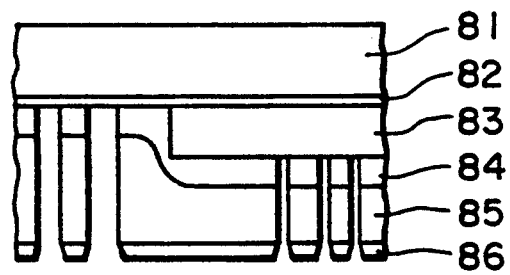
Figure 16C:
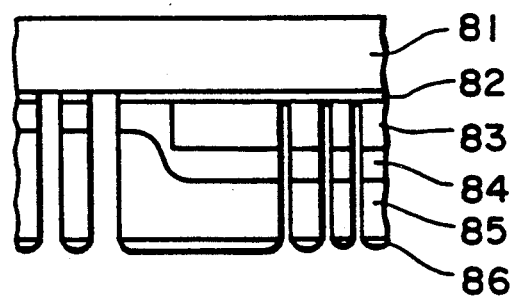
Figure 16D:
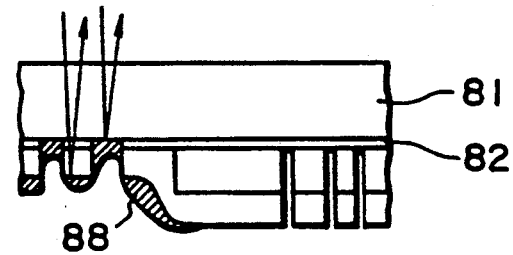
Figure 18F:
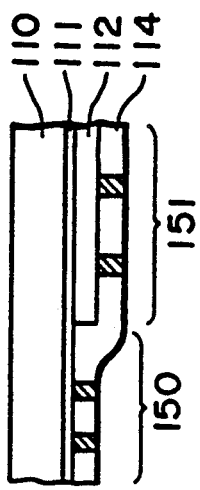
FIGS. 18(a) through 18(h) are a schematic representation, showing a seventh embodiment of the present invention.
Figure 18G:
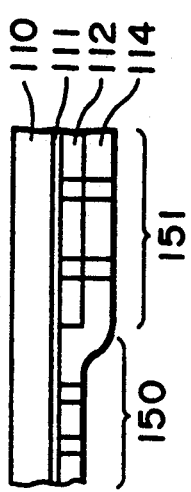
Figure 18H:
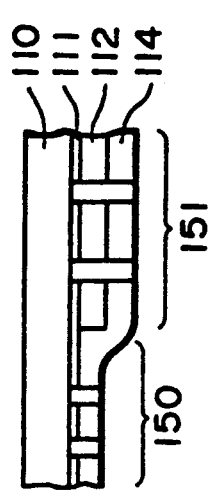
Figure 18I:
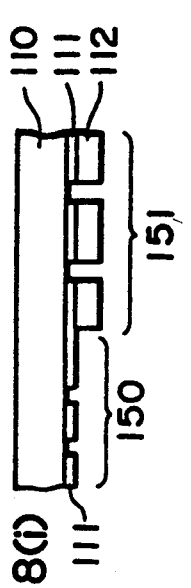
Figure 18A:
Figure 18B:
Figure 18C:
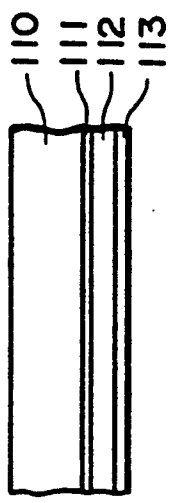
Figure 18D:
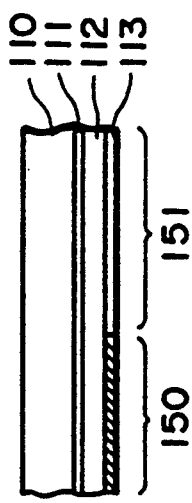
Figure 18E:
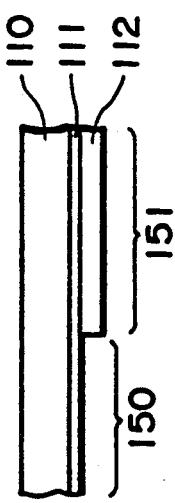

Description will now be made of an example of a mask having a reflection type phase grating, adapted to use reflectively diffracted light. Referring to FIG. 15, the basic structure of such a mask having a reflection type phase grating will be explained. FIG. 15 is a sectional view of a mask having a reflection type phase grating. In FIG. 15, denoted at 81 is a mask base material; at 82 is a circuit pattern film material that provides contrast to the semiconductor circuit printing light; at 83 is a dielectric material which is transparent with respect to alignment light; at 84 is a metal film; at 85 is an alignment pattern area; and at 86 is a semiconductor circuit pattern area. Reference numerals 87 and 88 depict reflective diffraction of the alignment light. Each of the mask material 81 and the dielectric material 83 is transparent with respect to the alignment light, and the film 84 comprises a metal reflective film. Accordingly, the thickness of the dielectric material 83 produces an optical path difference between the light 87 and the light 88 by which a mask having a reflection type phase grating is accomplished. For example, if the thickness of the dielectric material 83 is denoted by d and the index of refraction thereof is denoted by n, the optical path difference between the light 87 and the light 88 is equal to "$2d \times n$". The first order reflective diffraction efficiency becomes maximum when the following relation is satisfied:

$$2nd = \lambda/2 \times N$$

where $\lambda$ is the wavelength of the alignment light and N is an odd number. Generally, the thickness d of the dielectric material 83 may be set appropriately in accordance with the value of diffraction efficiency. As an example, when $n=1.5$, if light of wavelength $\lambda=0.83$ micron is used, diffraction efficiency of the first order diffraction light becomes maximum by setting the thickness d to satisfy the following relation:

$$\begin{aligned} d &= \lambda/2 \times 1/2n \\ &= 0.83/2 \times 1/(2 \times 1.5) \\ &= 0.138 \text{ (micron)} \end{aligned}$$

Accordingly, the diffraction efficiency can be changed by changing the thickness d and/or the refractive index n.

Next, the manner of manufacturing such a mask having a reflection type phase grating will be explained with reference to the following drawings.

Embodiment 5

FIGS. 16(a) through 16(h) show a fifth embodiment of the present invention. In this embodiment, the reflection type phase grating is formed on a SiN base material, by using Ta. Part (a) to part (d) illustrate the sequential steps of manufacture of the mask.

First, in part (a), a $SiO_2$ film 82 having a thickness $d_1 = 700$ angstroms is formed on a mask base material 81. Thereafter, an absorptive material film 83 is formed on such a portion in which a circuit pattern is to be formed, by using Ta and in a manner similar to that of the preceding embodiment. The Ta film formation is performed by using an RF sputtering method. Subsequently, an $SiO_2$ film that provides a phase grating material 84 is formed with a thickness $d_2$, by sputtering like the formation of the film 82. Here, the thickness $d_1$, the thickness $d_2$ and the refractive index n of the $SiO_2$ film to be formed by vacuum deposition, are set so that the product (nd) of the refractive index n with the total thickness d $(=d_1+d_2)$ becomes equal to a quarter ($\frac{1}{4}$) of the wavelength of the alignment light. For example, when $\lambda = 8300$ angstroms and $n = 1.45$, the thickness d that satisfies $nd = /4$ is 1430 angstroms. Accordingly, if $d_1 = 700$ angstroms as described, the thickness $d_2$ may be set to 730 angstroms.

Subsequently, in part (b), as a lower layer material 85 of a multilayered resist film, a novolak resin series photoresist, for example, AZ-2400 (trade name) manufactured by Hext Corporation, is applied with a thickness of 8000 angstroms. Also, as an upper layer resist 86, a silicon series EB resist, for example, Toyobeam SNR (trade name) manufactured by Toso Co., Japan, is applied with a thickness of 2500 angstroms. After prebaking in accordance with an ordinary process, an electron beam pattern drawing apparatus is used to draw an alignment pattern and a circuit pattern in a single pattern printing operation, as in the embodiments described hereinbefore, whereby a resist pattern is formed on the upper layer resist 86. By using the thus formed resist pattern as a masking member, dry etching with oxygen is performed to form a resist pattern on the lower layer resist 85.

Subsequently, by using a gas of $CF_4$ with $C_2H_4$ as an active gas, the $SiO_2$ film 84 is etched. The etching is continued until the surface of the absorptive material layer 83 is uncovered, namely, through the thickness $d_2$. Subsequently, as seen in part (c), the active gas is replaced by $CbrF_3$ (carbon trifluoride bromide) and the etching is continued under the condition that the etching rates of Ta and $SiO_2$ are at a ratio of 10:1. If the thickness of the absorptive material layer 83 and the thickness of the $SiO_2$ film 82 at a portion where no absorptive material layer 83 is formed, are at a ratio of 10:1, then at the moment whereat the pattern formation through the etching of the absorptive material 83 is completed, the etching of the film 82 is completed and the thickness $(=d_1+d_2)$ of the alignment pattern formed in the $SiO_2$ films 82 and 84 is equal to 1430 angstroms.

Then, in part (c), the resist materials 85 and 86 are removed and, thereafter, a fresh resist is applied to the mask structure. Then, like the foregoing embodiments, light exposure is made to pattern the applied fresh resist so that the circuit pattern portion (Ta material portion) is covered while the alignment mark portion ($SiO_2$ material portion) is uncovered. Then, a reflective gold film 88 is formed by vacuum deposition with a thickness of 1000 angstroms. After this, the resist is removed, whereby a mask having a circuit pattern and an alignment pattern formed by a reflection type phase grating, as illustrated in part (d), is obtained.

Embodiment 6

FIGS. 17(a) through 17(h) show a sixth embodiment of the present invention. In this embodiment, by using Cr, a circuit pattern is formed on a quartz mask base. This embodiment is adapted to manufacture a mask to be used in ultraviolet light exposure, wherein a reflective phase type alignment pattern and a circuit pattern are provided. Generally, a mask for the ultraviolet light exposure comprises a mask base material formed by a quartz substrate, and a circuit pattern is formed by a Cr film (light blocking material) of a thickness of about 1000 angstroms. Part (a) to part (h) illustrate the sequence of mask manufacturing processes according to this embodiment. Part (i) illustrates the section of a finished mask.

Part (a) depicts a quartz blank with chromium, which is a material for the mask manufacture. Reference numeral 91 denotes the base material of quartz, and reference numeral 92 denotes a vacuum deposited chromium film with which a pattern is to be formed.

First, removal of the metal film (chromium) is performed to allow coating of the blank with a dielectric material film. As seen in part (b), a photoresist 93 is applied to the metal film 92 and, subsequently, like the preceding embodiments such a portion of the resist 93 corresponding to the zone of the metal film 92 to be removed, is exposed to light. The exposed portion of the resist is then removed by development. After this, as seen in part (c), by using the thus formed pattern of the resist 93 the metal film 92 is etched and removed to uncover the mask base surface of the base material 91. Subsequently, as seen in part (d), a dielectric material film 94 is formed by an electron beam vacuum deposition method, for example, and the resist 93 is removed and, at the same time, the dielectric material on the metal film 92 is removed. The result is illustrated in part (e). Here, the thickness d of the dielectric material film 94 is selected so that, with respect to the light to be used for the alignment operation, the optical path length nd (where n is the index of refraction) corresponds to a quarter (¼) of the wavelength. That is, if the dielectric material 94 is composed of $SiO_2$ having a refractive index of 1.4 and the alignment light used has a wavelength of 0.83 micron, then the film thickness d is equal to 0.148 micron.

What is important in the manufacture of a mask is the relative position of each alignment pattern and a circuit pattern on the mask, and thus these patterns have to be formed at high precision. Accordingly, it is desirable to draw these patterns at once through an electron beam exposure or the like. Part (f) illustrates a resist pattern for the alignment pattern and the circuit pattern, as obtained by providing a resist coating 95 for the electron beam exposure, by performing the electron beam exposure and finally by developing the resist.

Then, the dielectric material and the metal film are removed by plasma etching. When the dielectric material and the metal film are composed of $SiO_2$ and Cr, respectively, a gas of $Cl_2$ with $C_2F_6$ may be used as an etching gas and, by changing the quantity of $O_2$ added, the etching rates to these materials can be controlled. Therefore, it is possible that the etching of $SiO_2$ (of a thickness not greater than 1500 angstroms) and the etching of Cr (of a thickness not greater than 1000 angstroms) are completed at the same time. By this, an alignment pattern 98 and a circuit pattern 99 are obtained. The result is illustrated in part (g).

Next, a reflection film 97 is formed on the alignment pattern 98. As seen in part (h), this can be done first by covering the circuit pattern 99 with a resist 96 in a similar manner as the preceding embodiments and second by vacuum depositing a reflection film material (e.g., aluminum, gold, silver, chromium). The thickness thereof can be set as desired, provided that a sufficiently high reflection factor is ensured.

A reflective phase type mask obtainable from the manufacturing processes described above; is illustrated in part (i). With the described mask manufacturing method, it is possible to provide a phase type mask having an alignment pattern formed by a dielectric transparent film, in which a reflection type phase grating is formed, and in which the positional relationship between the alignment pattern and the semiconductor circuit pattern is ensured with high precision.

Embodiment 7

FIGS. 18(a) through 18(h) illustrate a seventh embodiment of the present invention. This embodiment is an example of a method of manufacture of an X-ray mask to be used in an X-ray exposure apparatus, wherein an alignment pattern is formed by a thin film of Cr (with a thickness not greater than 0.1 micron) or the like having sufficient contrast to the alignment light, and wherein a circuit pattern is formed by a thick film of Au, Ta or the like (with a thickness of 0.7–1.0 micron).

In part (a), numeral 110 denotes an SiN membrane and numeral 111 denotes a Cr film. The Cr film has a thickness of about 0.1 micron, and it is formed by vacuum deposition. As seen in part (b), through sputtering, a Ta film 112 is formed on the Cr film 111 with a thickness of 0.7–1.0 micron. To this Ta film, a resist 113 is applied and, thereafter, light exposure is made in accordance with the separation of an alignment pattern area 150 and a circuit pattern area 151. The result is illustrated in part (d). The portion 113 of the resist as depicted by hatching is the area having been exposed to the light. Subsequently, the resist is developed and, by dry etching with $CBrF_3$, a structure such as illustrated in part (e) is obtained. Then, a resist 114 is uniformly applied to the obtained structure. At this time, the resist 114 may be applied with a slightly larger thickness in accordance with a selected etching ratio with the Ta film 112. Alternatively, it may be applied to allow successive etching of the Ta film 112 and the Cr film 111 by using a multilayered resist process. After the resist application, as seen in part (f), an electron beam is used to draw an alignment pattern and a circuit pattern in a single printing operation. By this, the positional relationship between the alignment pattern and the circuit pattern is ensured very accurately, with the precision of the electron beam pattern drawing apparatus used i.e., 0.01–0.1 micron).

It is to be noted here that a precision of about 1 micron or more is sufficient for the positional precision with respect to the exposure for the area division, and such area dividing exposure can be made by using a mirror projection exposure apparatus capable of exposing a wide area at a unit magnification.

Figure 8:
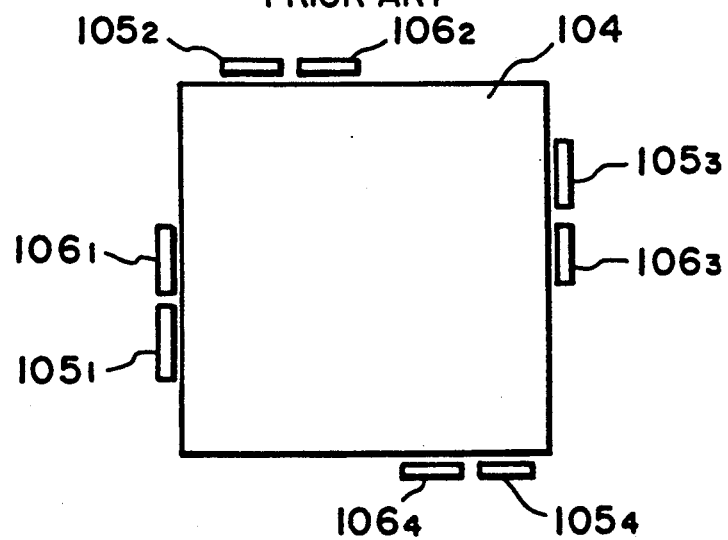
FIG. 8 is a plan view showing an example of mask usable in an X-ray exposure apparatus.
Figure 9:
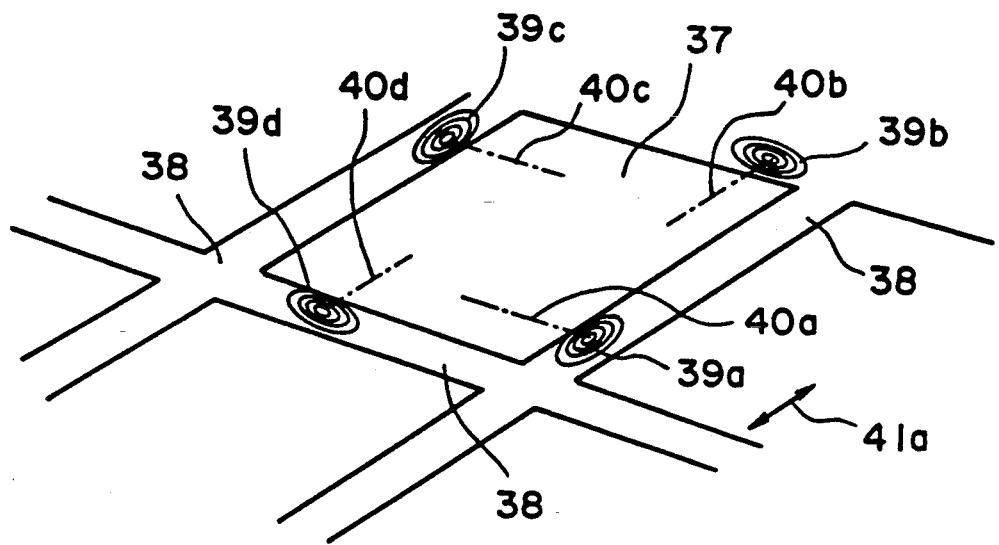
FIG. 9 is a schematic view showing an example of disposition of a circuit pattern and alignment patterns on a mask.
Figure 10:
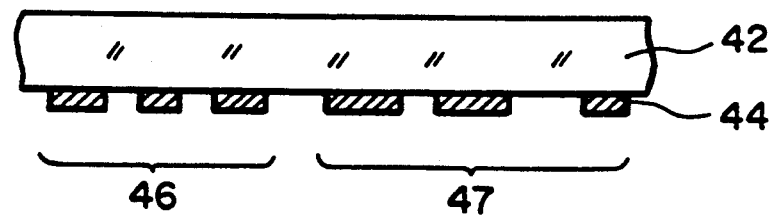
FIG. 10 is a schematic view showing an example of a known type mask used for lithography with light.
Figure 11E:
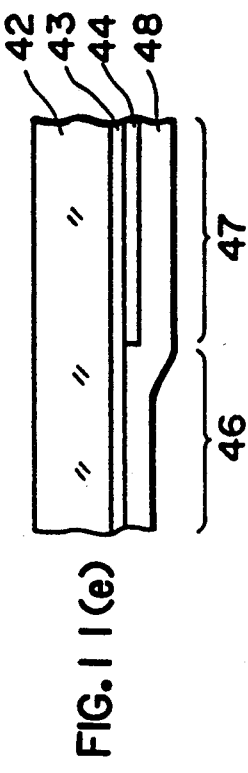
FIGS. 11(a) through 11(h) are a schematic representation, illustrating a mask manufacturing method according to a first embodiment of the present invention.
Figure 11F:
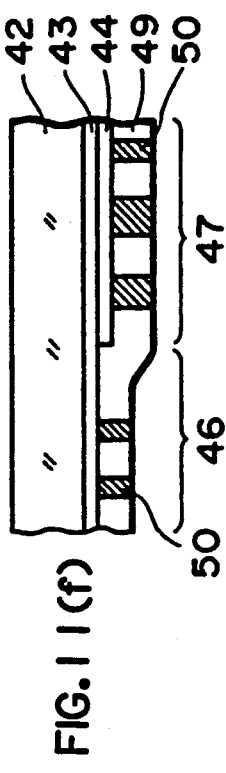
Figure 11G:
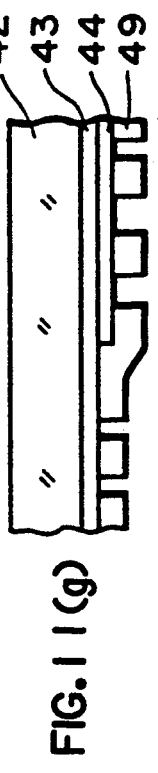
Figure 11H:
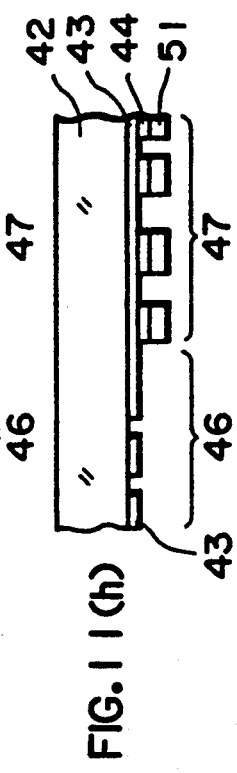
Figure 11A:
Figure 11B:
Figure 11C:
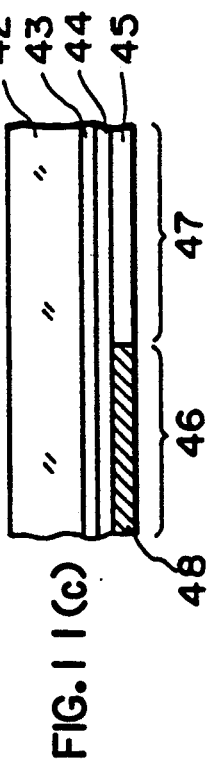
Figure 11D:
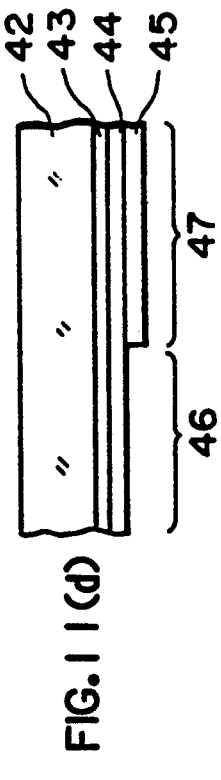
Figure 14E:
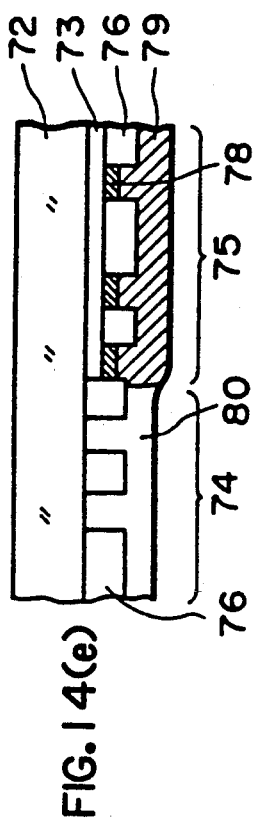
FIGS. 14(a) through 14(b) are a schematic representation, showing a fourth embodiment of the present invention.
Figure 14F:
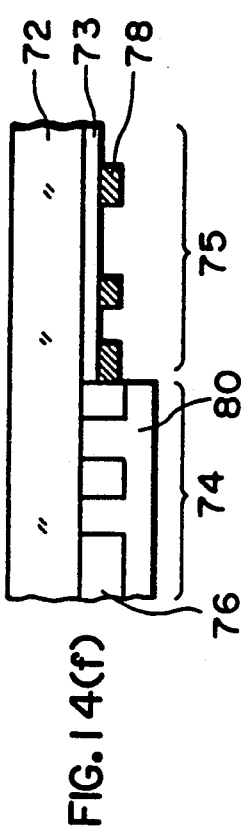
Figure 14G:
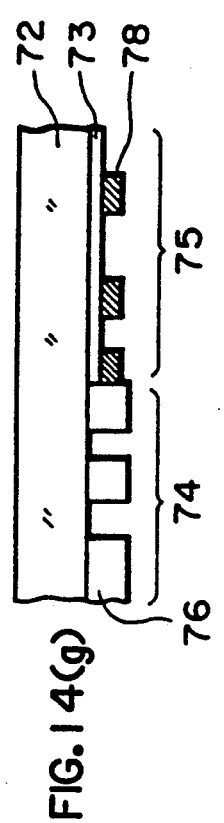
Figure 14H:
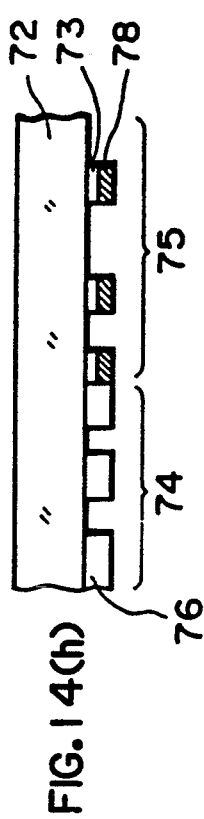
Figure 14A:
Figure 14B:
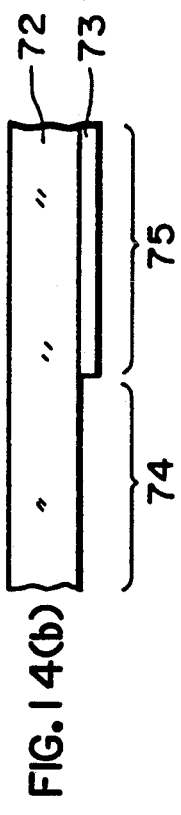
Figure 14C:
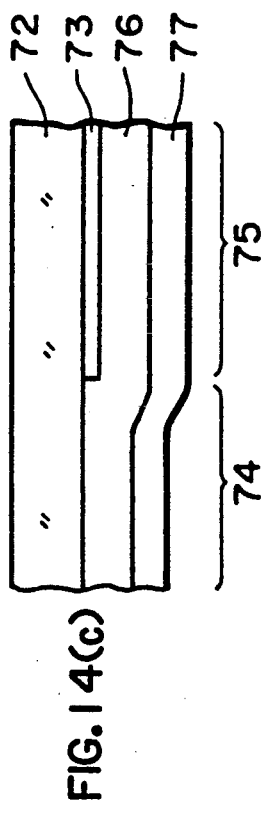
Figure 14D:
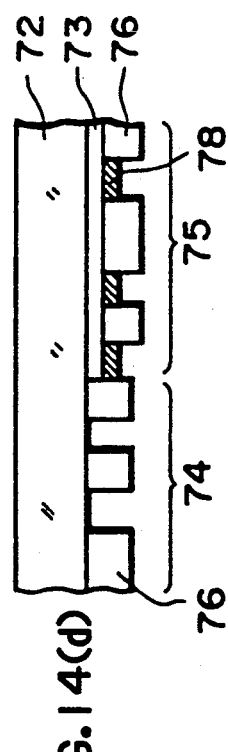

After the electron beam pattern drawing in part (f), the resist is developed and, by using the thus formed resist pattern, the Ta film 112 is subjected to dry etching by using $CBrF_3$. After the dry etching of the Ta film 112, a gas of $Cl_2$ with $C_2F_6$ is used while changing the quantity of $O_2$ added, to perform the etching of the Cr film 111. The result is illustrated in part (h). After the etching of the Cr film 111 is completed, the resist 114 is removed, whereby a mask of a desired structure such as illustrated in part (i) is obtained. In the mask as shown in the sectional view of part (i), as in the case of FIG. 8, the alignment patterns $105_1$–$105_4$ each is composed of a Cr film 111, while the circuit pattern 104 and the alignment patterns $106_1$–$106_4$ each is composed of a Ta film 112.

The present embodiment is not limited to use of the Cr film, but such a material, like Al, for example, as providing sufficient contrast to the alignment light with a small thickness of about 0.1 micron, may be used. Also, the Ta film may be replaced by such a material, like Au, for example, as providing sufficient contrast with respect to the X-rays.

While the invention has been described with reference to the structures disclosed herein, it is not confined to the details set forth and this application is intended to cover such modifications or changes as may come within the purposes of the improvements or the scope of the following claims.

What is claimed is:

1. A mask for use in transferring a semiconductor device manufacturing circuit pattern onto a semiconductor substrate, said mask comprising:

a base having a first zone for receiving an alignment pattern and a second zone for receiving a circuit pattern, wherein said first zone is irradiated with an alignment beam for alignment of the semiconductor substrate and the mask while said second zone is irradiated with an exposure beam for the transfer of the circuit pattern onto the semiconductor substrate;

an alignment pattern forming material provided in a portion of said first zone for forming an alignment pattern of phase type on said base, said alignment pattern forming material producing light corresponding to the alignment pattern in response to irradiation of said first zone with the alignment beam; and a circuit pattern forming material being different from said alignment pattern forming material and provided in a portion of said second zone for forming the circuit pattern forming material, said circuit pattern forming material producing contrast corresponding to the circuit pattern in response to the irradiation of said second zone with the exposure beam.

2. A mask according to claim 1, wherein said alignment pattern forming material is transparent with respect to light used for the alignment of said mask.

3. A mask according to claim 2, wherein said alignment pattern forming material comprises a dielectric material.

4. A mask according to claim 2, wherein said alignment pattern forming material comprises at least one of $SiO_2$, $ZrO_2$, $MgF_2$, $TiO_2$ and $Al_2O_3$.

5. A mask according to claim 1, wherein said circuit pattern forming material comprises a metal material which provides contrast with respect to X-rays.

6. A mask according to claim 5, wherein said circuit pattern forming material comprises at least one of Au, Cr, Ta, W and $WN_x$.

7. A mask according to claim 1, wherein said base comprises at least one of $SiO_2$, SiN, AlN, SiC and polyimide.

8. A mask according to claim 1, further comprising a reflective material with which the alignment pattern in said first zone is coated.

9. A method of producing a mask for use in transferring a semiconductor device manufacturing circuit pattern onto a semiconductor substrate, said method comprising:

providing a base having a plurality of zones;

providing an alignment pattern forming material in a first zone of the base to form a phase type pattern;

providing in a second zone of the base a circuit pattern forming material different from the alignment pattern forming material;

applying a photoresist to the base to position the alignment pattern forming material and the circuit pattern forming material between the base and the applied photoresist; and exposing the photoresist, at least in the first and second zones, with an electron beam to form an alignment pattern of phase type with the alignment pattern forming material and a circuit pattern with the circuit pattern forming material.

10. A method according to claim 9, wherein the alignment pattern forming material produces a light corresponding to the alignment pattern in response to irradiation of the first zone with an alignment beam, and the circuit pattern forming material produces contrast corresponding to the circuit pattern in response to irradiation of the second zone with an exposure beam.

11. A method according to claim 10, wherein the alignment pattern forming material has transparency to the alignment beam and wherein the alignment pattern forming material comprises at least one of $SiO_2$, $ZrO_2$, $MgF_2$, $TiO_2$ and $Al_2O_3$.

12. A method according to claim 11, wherein the circuit pattern forming material comprises at least one of Au, Cr, Ta and $WN_x$.

13. A method according to claim 12, wherein the base comprises at least one of Si, SiN, AlN, SiC and polyimide.

14. A method according to claim 13, further comprising providing a reflecting material in the first zone and forming the alignment pattern between the base and the reflecting material.

15. A method according to claim 9, further comprising etching, after development of the photoresist, at least one of the alignment pattern forming material and the circuit pattern forming material by using a corresponding resist pattern so that, after the development, the photoresist has a resist pattern in the first zone corresponding to the alignment pattern and another resist pattern in the second zone corresponding to the circuit pattern.

16. A method according to claim 15, further comprising positioning the alignment pattern forming material between the base and the circuit pattern forming material, and removing, after the positioning, the circuit pattern forming material in the first zone.

17. A method according to claim 16, further comprising removing the circuit pattern forming material in the first zone by etching.

18. A method according to claim 15, further comprising providing the circuit pattern forming material in a portion of the base outside the first region and, thereafter, providing the alignment pattern forming material on the base so that the circuit pattern forming material is positioned between the base and the alignment pattern forming material.

19. A method according to claim 18, further comprising providing the circuit pattern forming material on the base and, thereafter, removing any of the circuit pattern forming material in the first zone.

20. A mask according to claim 1, wherein the alignment pattern comprises a phase type diffraction grating.

21. A mask according to claim 20, wherein the diffraction grating comprises a zone plate.

22. A method according to claim 9, wherein the alignment pattern comprises a phase type diffraction grating.

23. A method according to claim 22, wherein the diffraction grating comprises a zone plate.

* * * * *

UNITED STATES PATENT AND TRADEMARK OFFICE
CERTIFICATE OF CORRECTION

PATENT NO. : 5,262,257           Page 1 of 3
DATED     : November 16, 1993
INVENTOR(S) : YASUAKI FUKUDA, ET AL.

It is certified that error appears in the above-indentified patent and that said Letters Patent is hereby corrected as shown below:

COLUMN 2:

Line 21, "between the" should read --between (i) the--.

COLUMN 4:

Line 1, "$106_{1\text{-}1064}$" should read --$106_1$-$106_4$--.

COLUMN 5:

Line 49, "12(h)" should read --(12g)--;
   Line 52, "13(h)" should read --13(j)--;
   Line 55, "14(b)" should read --14(h)--;
   Line 63, "17(h)" should read --17(i)--;
   Line 64, "sixth ," should read --sixth--; and
   Line 66, "18(h)" should read --18(i)--.

COLUMN 6:

Line 5, "illustrates" should read --illustrate--.

COLUMN 7:

Line 25, "12(h) illustrates" should read --12(g) illustrate--.

COLUMN 9:

Line 2, "patter" should read --pattern--; and
   Line 34, "14(h)" should read --14(h),--.

UNITED STATES PATENT AND TRADEMARK OFFICE
CERTIFICATE OF CORRECTION

PATENT NO. : 5,262,257　　　　　　　　　Page 2 of 3
DATED : November 16, 1993
INVENTOR(S) : YASUAKI FUKUDA, ET AL.

It is certified that error appears in the above-indentified patent and that said Letters Patent is hereby corrected as shown below:

COLUMN 10:

Line 7, "results" should read --results.--.

COLUMN 11:

Line 27, "16(h)" should read --16(d)--.

COLUMN 12:

Line 6, "CbrF$_3$" should read --CBrF$_3$--; and
Line 15, "(=d$_{1+d2}$)" should read --(=d$_1$+d$_2$)--.

COLUMN 13:

Line 38, "above;" should read --above--; and
Line 48, "18(h)" should read --18(i)--.

UNITED STATES PATENT AND TRADEMARK OFFICE
CERTIFICATE OF CORRECTION

PATENT NO. : 5,262,257
DATED : November 16, 1993
INVENTOR(S) : YASUAKI FUKUDA, ET AL.

It is certified that error appears in the above-indentified patent and that said Letters Patent is hereby corrected as shown below:

<u>COLUMN 14</u>:

Line 15, "used ie.," should read --used (i.e.,--.

Signed and Sealed this

Fifth Day of July, 1994

BRUCE LEHMAN

Attest:

Attesting Officer

Commissioner of Patents and Trademarks